US010943923B2

(12) United States Patent
Jeong et al.

(10) Patent No.: US 10,943,923 B2
(45) Date of Patent: Mar. 9, 2021

(54) INTEGRATED CIRCUITS AND SEMICONDUCTOR DEVICE INCLUDING STANDARD CELL

(71) Applicant: SAMSUNG ELECTRONICS CO., LTD., Suwon-si (KR)

(72) Inventors: Jinwoo Jeong, Suwon-si (KR); Jiwook Kwon, Suwon-si (KR); Sutae Kim, Suwon-si (KR); Hyelim Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/574,339

(22) Filed: Sep. 18, 2019

(65) Prior Publication Data

US 2020/0321355 A1 Oct. 8, 2020

(30) Foreign Application Priority Data

Apr. 2, 2019 (KR) .......................... 10-2019-0038257

(51) Int. Cl.
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/1182* (2013.01); *H01L 2027/11812* (2013.01); *H01L 2027/11866* (2013.01); *H01L 2027/11885* (2013.01)

(58) Field of Classification Search
None
See application file for complete search history.

(56) References Cited

U.S. PATENT DOCUMENTS

| | | | |
|---|---|---|---|
| 8,987,128 B2 | 3/2015 | Rashed et al. | |
| 9,236,300 B2* | 1/2016 | Liaw | H01L 21/76816 |
| 9,437,588 B1 | 9/2016 | Zeng et al. | |
| 9,449,970 B2 | 9/2016 | Do et al. | |
| 9,589,955 B2 | 3/2017 | Baek et al. | |
| 9,704,862 B2 | 7/2017 | Park et al. | |
| 9,905,487 B1 | 2/2018 | Lam et al. | |
| 9,972,691 B2 | 5/2018 | Kawano | |
| 10,090,325 B1 | 10/2018 | Liaw | |
| 10,505,546 B2* | 12/2019 | Song | H01L 27/0924 |
| 2012/0254817 A1* | 10/2012 | Sherlekar | G06F 30/39 |
| | | | 716/119 |

(Continued)

*Primary Examiner* — Bo B Jang
(74) *Attorney, Agent, or Firm* — Lee IP Law. P.C.

(57) ABSTRACT

A semiconductor device including first and second active regions extending in a first direction; a field region between the first and second active regions; a gate structure including an upper gate electrode overlapping the first active region and extending in a second direction crossing the first direction, and a lower gate electrode overlapping the second active region, extending in the second direction, and on a same line as the upper gate electrode; a gate isolation layer between the upper and lower gate electrodes; source/drain regions on respective sides of the upper gate electrode; a contact jumper crossing the upper gate electrode in the first active region and electrically connecting the source/drain regions; and a first upper contact extending in the second direction in the field region and overlapping the lower gate electrode and the gate isolation layer, wherein the upper gate electrode is a dummy gate electrode.

20 Claims, 10 Drawing Sheets

(56) References Cited

U.S. PATENT DOCUMENTS

| | | | |
|---|---|---|---|
| 2013/0200395 A1* | 8/2013 | Liaw | H01L 27/11 257/77 |
| 2013/0200462 A1 | 8/2013 | Becker et al. | |
| 2018/0108646 A1 | 4/2018 | Lee et al. | |
| 2018/0315821 A1 | 11/2018 | Xie et al. | |

* cited by examiner

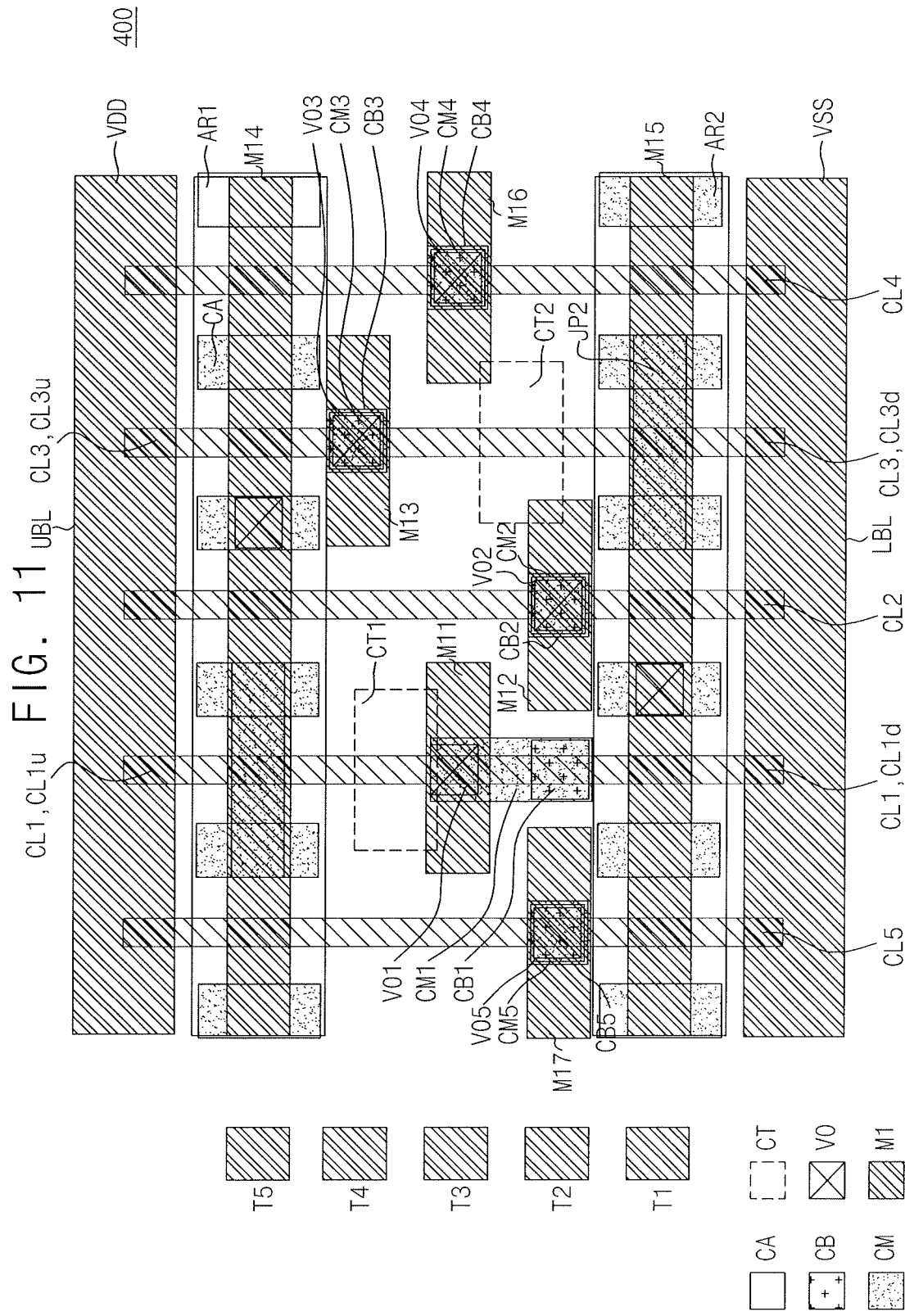

US 10,943,923 B2

INTEGRATED CIRCUITS AND SEMICONDUCTOR DEVICE INCLUDING STANDARD CELL

CROSS-REFERENCE TO RELATED APPLICATION

Korean Patent Application No. 10-2019-0038257, filed on Apr. 2, 2019, in the Korean Intellectual Property Office, and entitled: "Integrated Circuits and Semiconductor Device Including Standard Cell," is incorporated by reference herein in its entirety.

BACKGROUND

1. Field

Embodiments relate to an integrated circuit and a semiconductor device including a standard cell.

2. Description of the Related Art

As the electronics industry develops to a high degree, properties of semiconductor devices are gradually increasing. For example, semiconductor devices may exhibit high reliability, high speed, and/or multifunctionality. In order to satisfy such properties, structures in the semiconductor devices may be more complex, and the semiconductor devices may be highly integrated.

SUMMARY

The embodiments may be realized by providing a semiconductor device including a first active region extending in a first direction; a second active region extending in the first direction; a field region between the first active region and the second active region; a gate structure including an upper gate electrode overlapping the first active region and extending in a second direction crossing the first direction, and a lower gate electrode overlapping the second active region, extending in the second direction, and on a same line as the upper gate electrode; a gate isolation layer between the upper gate electrode and the lower gate electrode; source/drain regions on respective sides of the upper gate electrode; a contact jumper in the first active region, the contact jumper crossing the upper gate electrode and electrically connecting the source/drain regions; and a first upper contact extending in the second direction in the field region and overlapping the lower gate electrode and the gate isolation layer, wherein the upper gate electrode is a dummy gate electrode.

The embodiments may be realized by providing an integrated circuit comprising a standard cell, wherein the standard cell includes a first active region and a second active region having different conductivity types and each extending in a first direction; a field region between the first active region and the second active region; a substrate; a first conductive line extending in a second direction that crosses the first direction, the first conductive line being on the substrate in the first active region, the second active region, and the field region; an isolation insulating layer in the field region, the isolation insulating layer separating the first conductive line into a first upper conductive line and a first lower conductive line and electrically insulating the first upper conductive line and the first lower conductive line from each other; a first lower contact in the field region and on the first lower conductive line; a first upper contact in the field region and on the first lower contact, the first upper contact extending in the second direction and overlapping the isolation insulating layer; and a contact jumper in the first active region, the contact jumper crossing the first upper conductive line, wherein the contact jumper is at a same level as or at a lower level than the first upper contact relative to a main surface of the substrate.

The embodiments may be realized by providing an integrated circuit comprising a standard cell, wherein the standard cell includes a first active region and a second active region having different conductivity types and each extending in a first direction; a field region between the first active region and the second active region; an upper conductive line in the first active region, the upper conductive line extending in a second direction that crosses the first direction; lower conductive lines in the second active region and the field region, the lower conductive lines extending in the second direction, being spaced apart from each other in the second direction, and being on a same line as the upper conductive line; an interconnection line in the field region, the interconnection line extending in the first direction and being between the upper conductive line and the lower conductive line in a plan view; and an upper contact in the field region, the upper contact extending in the second direction and overlapping the interconnection line and the lower conductive line, wherein the lower conductive line is electrically connected to the interconnection line, and the upper conductive line is electrically insulated from the lower conductive line.

BRIEF DESCRIPTION OF THE DRAWINGS

Features will become apparent to those of skill in the art by describing in detail exemplary embodiments with reference to the attached drawings in which:

FIG. 4b illustrates a cross-sectional view taken along line I-I' of FIG. 4a.

FIG. 5b illustrates a cross-sectional view taken along line I-I' of FIG. 5a.

FIG. 6b illustrates a cross-sectional view taken along line I-I' of FIG. 6a.

FIG. 11 illustrates a layout view of a portion of a unidirectional standard cell of a multiplexer having a cross-couple structure XC according to an example embodiment.

DETAILED DESCRIPTION

Figure 1:
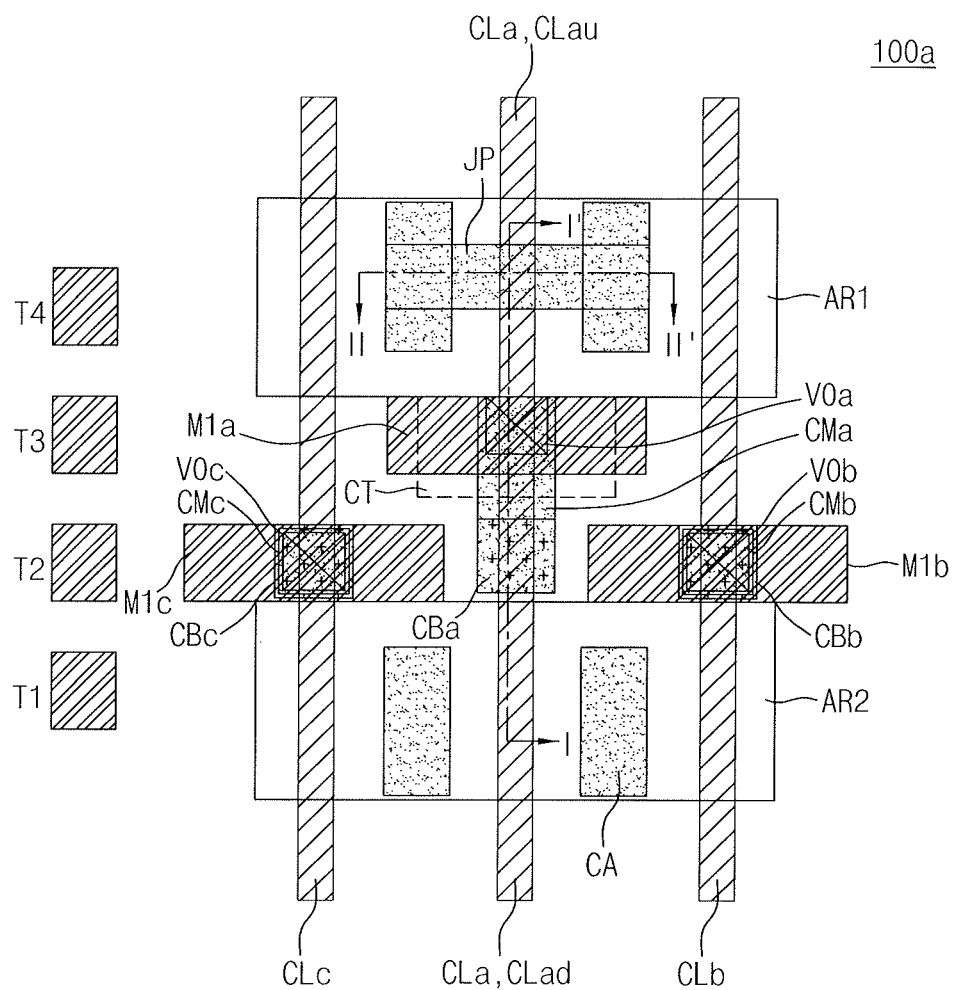
FIG. 1 illustrates a layout view of a partial configuration of an integrated circuit including a unidirectional standard cell according to an example embodiment.
Figure 2:
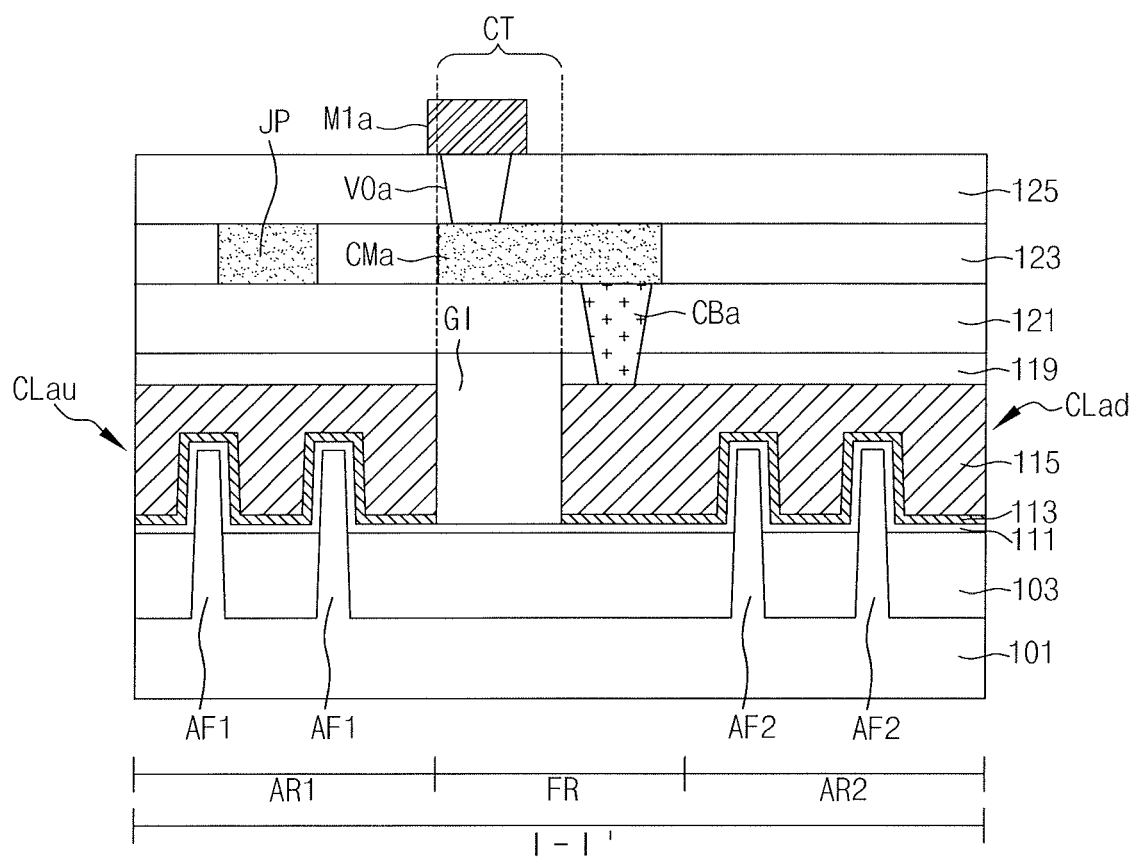
FIG. 2 illustrates a cross-sectional view taken along line I-I' of FIG. 1.

FIG. 1 illustrates a layout view of a partial configuration of an integrated circuit including a unidirectional standard cell according to an example embodiment. FIG. 2 illustrates a cross-sectional view taken along line I-I' of FIG. 1. FIG.

3 illustrates a cross-sectional view taken along line II-II' of FIG. 1. A semiconductor device shown in FIGS. 2 and 3 may be an example of a semiconductor device implemented according to the layout of FIG. 1.

In FIG. 1, only a portion of a unidirectional standard cell is shown for convenience of description, and the unidirectional standard cell may be designed to further include other components. In an implementation, as illustrated in FIG. 1, the unidirectional standard cell may have an M1 interconnection structure having four tracks T1, T2, T3, and T4. In an implementation, the unidirectional standard cell may further include an M2 interconnection structure higher in level than the M1 interconnection structure.

In this specification, the term "M1 interconnection structure" may refer to interconnection lines formed at a level closest to a plurality of conductive lines among multilayer interconnection structures formed on the plurality of conductive lines. The plurality of interconnection lines constituting the "M1 interconnection structure" may be a plurality of unidirectional interconnection layers extending in parallel to each other in a direction crossing in an extending direction of the plurality of conductive lines.

Figure 3:
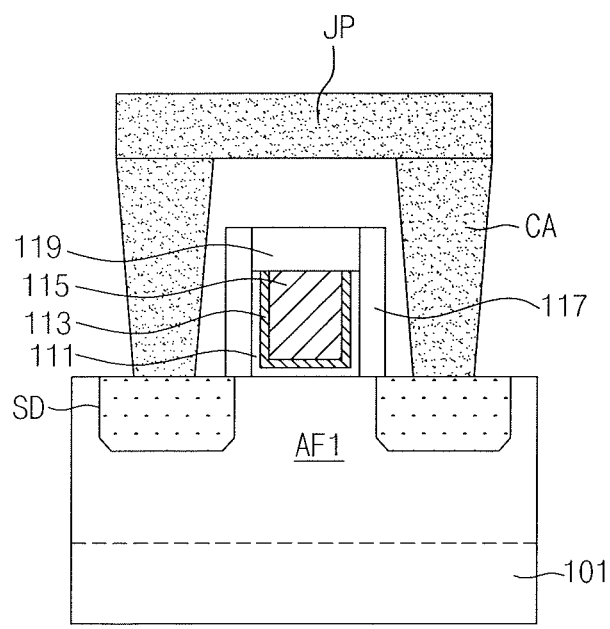
FIG. 3 illustrates a cross-sectional view taken along line II-II' of FIG. 1.

Referring to FIGS. 1 to 3, an integrated circuit 100a may include a substrate 101, a first active region AR1, a second active region AR2, a field region FR, active fins AF1 and AF2, first to third conductive lines CLa, CLb, and CLc, source/drain contacts CA, a contact jumper JP, lower contacts CB, upper contacts CM, vias V0, a gate isolation layer GI, and interconnection lines M1. The integrated circuit 100a may be designed using a standard cell library, and the first and second active regions AR1 and AR2, the first to third conductive lines CLa, CLb, and CLc, a cutting layer CT, and the contact jumper JP may be part of the standard cell.

The substrate 101 may be, e.g., a semiconductor substrate. The substrate 101 may include, e.g., silicon (Si), strained silicon, a silicon alloy, silicon carbide (SiC), silicon germanium (SiGe), silicon germanium carbide (SiGeC), germanium (Ge), a germanium alloy, gallium arsenide (GaAs), indium arsenide (InAs), a III-V group semiconductor, a III-VI group semiconductor, a combination thereof, or a laminate thereof. In an implementation, the substrate 101 may be an organic plastic substrate rather than the semiconductor substrate. As used herein, the term "or" is not an exclusive term, e.g., "A or B" could include A, B, or A and B. Hereinafter, an embodiment in which the substrate 101 is made of silicon is described.

A first active region AR1 and a second active region AR2 may extend (e.g., lengthwise) in a first direction and may be parallel to each other (e.g., and spaced apart) in a second direction substantially perpendicular to the first direction. The first active region AR1 and the second active region AR2 may have different conductivity types. In an implementation, the first active region AR1 may be a p-channel metal-oxide-semiconductor (PMOS) region and the second active region AR2 may be an n-channel metal-oxide-semiconductor (NMOS) region. In an implementation, the first active region AR1 may be an NMOS region and the second active region AR2 may be a PMOS region. The first active region AR1 and the second active region AR2 may be spaced apart from each other in the second direction, and the field region FR may be between the first active region AR1 and the second active region AR2.

First active fins AF1 and second active fins AF2 may extend in the first direction and may be parallel to each other (e.g., and spaced apart) in the second direction. In an implementation, the first active fins AF1 and the second active fins AF2 may be spaced a certain interval from each other. The first active fins AF1 may be in the first active region AR1 and the second active fins AF2 may be in the second active region AR2. The number of the first active fins AF1 and the second active fins AF2 in the integrated circuit 100a may be variously changed according to the example embodiment. In an implementation, dummy fins may be in the field region FR.

A device isolation layer 103 may be on the substrate 101 and may cover portions of the first active fin AF1 and the second active fin AF2. The device isolation layer 103 may include, e.g., silicon oxide, silicon nitride, silicon oxynitride, or a combination thereof.

The first to third conductive lines CLa, CLb, and CLc may cross the first active region AR1, the second active region AR2, and the field region FR in the second direction and may be parallel to each other and spaced apart in the first direction. The first to third conductive lines CLa, CLb, and CLc may be made of a suitable material having electrical conductivity and may include, e.g., polysilicon, a metal, a metal alloy, or the like. In an implementation, the first to third conductive lines CLa, CLb, and CLc may correspond to gate electrodes or gate structures. In an implementation, the first to third conductive lines CLa, CLb, and CLc may be any traces having conductivity.

In the example embodiment shown in FIGS. 1 to 3, the first to third conductive lines CLa, CLb, and CLc may correspond to gate structures. The gate structure may include a gate insulating layer 111, gate electrodes 113 and 115, gate spacers 117, and a gate capping layer 119.

The gate insulating layer 111 may be made of, e.g., a silicon oxide film, a high-k dielectric film, or a combination thereof. The high-k dielectric film may be a material having a higher dielectric constant than the silicon oxide film. In an implementation, the gate insulating layer 111 may include, e.g., a metal oxide or metal oxynitride having a dielectric constant of about 10 to 25. In an implementation, the high-k dielectric film may include, e.g., hafnium oxide.

The gate electrodes 113 and 115 may be formed as a plurality of layers. For example, the gate electrodes 113 and 115 may include a first gate electrode 113 and a second gate electrode 115. The first gate electrode 113 may include, e.g., Ti, Ta, W, Ru, Nb, Mo, or Hf. The second gate electrode 115 may include, e.g., W or Al. The gate structure may include a work-function metal-containing layer. The work-function metal-containing layer may include, e.g., Ti, W, Ru, Nb, Mo, Hf, Ni, Co, Pt, Yb, Tb, Dy, Er, or P. The gate structure may include, e.g., a TiAlC/TiN/W laminated structure, a TiN/TaN/TiAlC/TiN/W laminated structure, or a TiN/TaN/TiN/TiAlC/TiN/W laminated structure.

The gate spacers 117 may be on both sidewalls of the gate insulating layer 111, the first gate electrode 113, and the second gate electrode 115. The gate spacers 117 may be made of, e.g., a silicon nitride film, SiOCN, SiCN, or a combination thereof.

Between the gate spacers 117, the gate capping layer 119 may be on the gate insulating layer 111, the first gate electrode 113, and the second gate electrode 115. The gate capping layer 119 may include nitride and may include, e.g., SiN.

The cutting layer CT may extend in the first direction between the first active region AR1 and the second active region AR2 and may cross the first conductive line CLa. In an implementation, at least a portion of the cutting layer CT may be in the first active region AR1. The cutting layer CT may be a marking layer for cutting a portion of the first conductive line CLa. In the integrated circuit 100a manufactured according to the layout including the cutting layer CT, the first conductive line CLa may be separated into an upper conductive line CLau (which crosses the first active region AR1) and a lower conductive line CLad (which crosses the second active region AR2) with respect to or by the cutting layer CT. In an implementation, the gate structure corresponding to the first conductive line CLa may include an upper gate structure and a lower gate structure which are substantially in or extend along a same line (e.g., along line I-I'). The upper gate structure may include an upper gate electrode, an upper gate insulating layer, an upper gate spacer, and an upper gate capping layer, and the lower gate structure may include a lower gate electrode, a lower gate insulating layer, a lower gate spacer, and a lower gate capping layer.

A portion of the first conductive line CLa (e.g., which has been removed or is otherwise not present in a region overlapping the cutting layer CT) may be filled with the gate isolation layer GI. The gate isolation layer GI may be referred to as an isolation insulating layer. The gate isolation layer GI may be made of nitride and may include, e.g., a silicon nitride (SiN). In an implementation, the gate isolation layer GI may be made of the same material as a first interlayer insulating layer 121 on the conductive lines CLa, CLb, and CLc. The upper conductive line CLau and the lower conductive line CLad may be electrically insulated from each other by the gate isolation layer GI. For example, the upper conductive line CLau may be a state of being electrically floated and unnecessary consumption of electric power in a region in which the jumper JP is present may be prevented.

In an implementation, the gate isolation layer GI may have a width in the first direction that is greater than a width of the first conductive line CLa in the first direction. In an implementation, the gate isolation layer GI may have a width in the first direction corresponding to or the same as that of the first conductive line CLa.

Source/drain regions SD may be on the first active fin AF1 and the second active fin AF2. The source/drain regions SD may each be on both sides of the conductive lines CLa, CLb, and CLc. The source/drain regions SD in the PMOS region may include a compressive stress material. In an implementation, the compressive stress material may be a material having a lattice constant greater than that of Si and may be, e.g., SiGe. The compressive stress material may apply compressive stress to the PMOS region so that mobility of carriers in a channel region may be improved. The source/drain regions SD in the NMOS region may include a tensile stress material. In an implementation, when the substrate 101 is made of Si, the source/drain regions SD may include Si or may include a material (e.g., SiC) having a lattice constant smaller than that of Si.

The source/drain contacts CA may extend in the second direction and may each be in the first and second active regions AR1 and AR2. Each of the source/drain contacts CA may be between two conductive lines that are adjacent to each other in the first direction. The source/drain contacts CA may be on the source/drain regions SD and may be electrically connected to the source/drain regions SD, respectively. The source/drain contacts CA may be referred to as source/drain contact patterns or source/drain contact plugs. The source/drain contacts CA may include a conductive material. The source/drain contacts CA may include, e.g., polysilicon, a metal silicide compound, a conductive metal nitride, or a metal. In an implementation, the source/drain contacts CA may include, e.g., W.

The contact jumper JP may be in the first active region AR1. The contact jumper JP may refer to a conductor having a relatively short length for connecting any two points or two terminals in an integrated circuit and may be referred to as a "jumper."

The contact jumper JP may be above the upper conductive line CLau to cross the upper conductive line CLau in the first direction. The contact jumper JP may be above the upper conductive line CLau. A lower (e.g., substrate-facing) surface of the contact jumper JP may be at a level higher than or equal to that of an upper (jumper-facing) surface of the gate structure or the gate capping layer 119 (e.g., a distance from a surface of the substrate 101 to the substrate-facing surface of the contact jumper JP may be greater than or equal to a distance from the surface of the substrate 101 to the jumper-facing surface of the gate structure or the gate capping layer 119). A width of the contact jumper JP in the second direction may correspond to (e.g., be equal to) or be greater than a width of the source/drain contact CA in the first direction and may correspond to (e.g., be equal to) or be smaller than a width of the source/drain contact CA in the second direction.

The contact jumper JP may be connected to each of the source/drain contacts CA on both sides of the upper conductive line CLau. The contact jumper JP may electrically connect regions on both sides of the upper conductive line CLau. Potentials of impurity regions on both sides of the upper conductive line CLau may be made equal to each other by the contact jumper JP. The upper conductive line CLau may be a dummy conductive line, e.g., a skipped conductive line, rather than a real conductive line. In an implementation, the upper gate electrode corresponding to the upper conductive line CLau may be a dummy gate electrode. In an implementation, the contact jumper JP may include the same conductive material as the source/drain contact CA.

Interlayer insulating layers 121, 123, and 125 may be in the first and second active regions AR1 and AR2, and may cover the conductive lines CLa, CLb, and CLc, the lower contacts CB, the upper contacts CM, and the vias V0. A first interlayer insulating layer 121 may be for electrical insulation of the lower contacts CB. A second interlayer insulating layer 123 may be for electrical insulation of the upper contacts CM. The first interlayer insulating layer 121 and/or the second interlayer insulating layer 123 may be for electrical insulation of the contacts CB and CM and the jumper JP. A third interlayer insulating layer 125 may be for electrical insulation of the vias V0. In an implementation, the first interlayer insulating layer 121 may be integrally formed with the gate isolation layer GI. For example, an insulating material may be formed so as to cover the conductive lines while filling a space corresponding to the cutting layer CT between the upper conductive line CLau and the lower conductive line CLad, thereby forming the gate isolation layer GI and the first interlayer insulating layer 121. In an implementation, the interlayer insulating layers 121, 123, and 125 may be formed using silicon oxide, such as borosilicate glass (BSG), phosphosilicate glass (PSG), borophosphosilicate glass (BPSG), undoped silicate glass (USG), tetraethyl orthosilicate (TEOS) glass, high-density plasma chemical vapor deposition (HDP-CVD) glass, or the like.

Interconnection lines M1a, M1b, and M1c may be above the conductive lines CLa, CLb, and CLc (e.g., relative to the substrate 101) to cross the conductive lines CLa, CLb, and CLc. The plurality of interconnection lines M1a, M1b, and M1c may be for signal routing. The interconnection lines M1a, M1b, and M1c may have a unidirectional structure extending in the first direction and may be coplanar. The interconnection lines M1a, M1b, and M1c may all have substantially the same width. The interconnection lines M1a, M1b, and M1c may correspond to a first level located at a lowermost portion of a back end of line (BEOL) of the integrated circuit.

A standard cell having a low cell height may be implemented using an M1 interconnection structure extending in parallel in one direction and a wide width of a power rail may be ensured. Accordingly, a degree of integration of the standard cell may be increased so that the standard cell may be applied to a miniaturization process.

A first interconnection line M1a may be arranged such that at least a portion thereof overlaps the gate isolation layer GI in a plan view. The first interconnection line M1a may be in the field region FR and may be closer to the first active region AR1 than to the second active region AR2. The first interconnection line M1a may be along a third track T3. The first interconnection line M1a may be at a position corresponding to that of the first conductive line CLa in the second direction in a plan view.

A second interconnection line M1b may be above the second conductive line CLb, and a third interconnection line M1c may be above the third conductive line CLc. The second interconnection line M1b and the third interconnection line M1c may extend in the first direction, which is the same direction as the extending direction of the first interconnection line M1a. The second interconnection line M1b and the third interconnection line M1c may be in or extend along a same line along a second track T2 and may be spaced apart from each other in the first direction. In a plan view, the second interconnection line M1b may be disposed on one side of a first upper contact CMa and the third interconnection line M c may be on the other side of the first upper contact CMa. The second interconnection line M1b and the third interconnection line M1c may be spaced apart from the first interconnection line M1a in the second direction. The second interconnection line M1b and the third interconnection line M1c maybe in the field region FR and may be closer to the second active region AR2 than to the first active region AR1. A distance from the second interconnection line M1b or the third interconnection line M1c to the contact jumper JP in the second direction may be greater than a distance from the first interconnection line M1a to the contact jumper JP in the second direction.

The first interconnection line M1a may be electrically connected to the lower conductive line CLad of the first conductive line CLa. The first interconnection line M1a may be electrically insulated from the upper conductive line CLau of the first conductive line CLa. The second interconnection line M1b may be electrically connected to the second conductive line CLb. The third interconnection line M1c may be electrically connected to the third conductive line CLc.

The electrical connection between the respective interconnection lines M and the conductive lines CLa, CLb, and CLc may be by or through the lower contacts CB, the upper contacts CM, and the vias V0. The lower contacts CB may be on the conductive lines CL, the upper contacts CM may be on the lower contacts CB, and the vias V0 may be on the upper contacts CM.

The lower contacts CB may be in the field region FR between the first active region AR1 and the second active region AR2. Sufficient distances may be secured between the lower contacts CB and the source/drain contacts CA by arranging the lower contacts CB in the field region FR without disposing the lower contacts CB in the second active region AR2. A first lower contact CBa may be on the lower conductive line CLad of the first conductive line CLa, a second contact CBb may be on the second conductive line CLb, and a third contact CBc may be on the third conductive line CLc. The first to third contacts CBa, CBb, and CBc may be substantially in a line in the first direction.

In an implementation, the first upper contact CMa may have a bar shape extending in the second direction on the first lower contact CBa. The first upper contact CMa may be referred to as a "bridge pattern." A lower portion of the first upper contact CMa may be between the second interconnection line M1b and the third interconnection line M1c in a plan view and may extend in the second direction so that an upper portion of the first upper contact CMa may overlap the gate isolation layer GI and the first interconnection line M1a in a plan view. The first upper contact CMa and the first interconnection line M1a may have extending directions that are perpendicular to each other in a plan view. A width of the first upper contact CMa in the first direction may be smaller than a shortest distance between the second interconnection line M1b and the third interconnection line M1c in the first direction.

A first via V0a may be between the first upper contact CMa and the first interconnection line M a and connected to each of the first upper contact CMa and the first interconnection line M1a. The first via V0a may electrically connect the first upper contact CMa to the first interconnection line M1a. The first via V0a may overlap the gate isolation layer GI, the first upper contact CMa, and the first interconnection line M1a in a plan view.

A second upper contact CMb may be on the second lower contact CBb and a second via V0b may be on the second upper contact CMb. The second lower contact CBb, the second upper contact CMb, the second via V0b, and the second interconnection line M1b (hereinafter, referred to as a second structure) may overlap each other in a plan view and may be electrically connected to each other. The third lower contact CBc, a third upper contact CMc, a third via V0c, and the third interconnection line M1c may also be configured in the same manner as the second structure. In an implementation, the upper contacts CM may be located at the same level as the jumper JP from or relative to a main surface of the substrate 101. In an implementation, the upper contacts CM may be located at a higher level than the jumper JP from or relative to the main surface of the substrate 101.

In an implementation, the first lower contact CBa, the first upper contact CMa, the first via V0a, and the first interconnection line M1a may be electrically connected to the lower conductive line CLad (i.e., the lower gate electrode) of the first conductive line CLa and may be electrically insulated from the upper conductive line CLau (i.e., the upper gate electrode) of the first conductive line CLa.

Figure 4A:
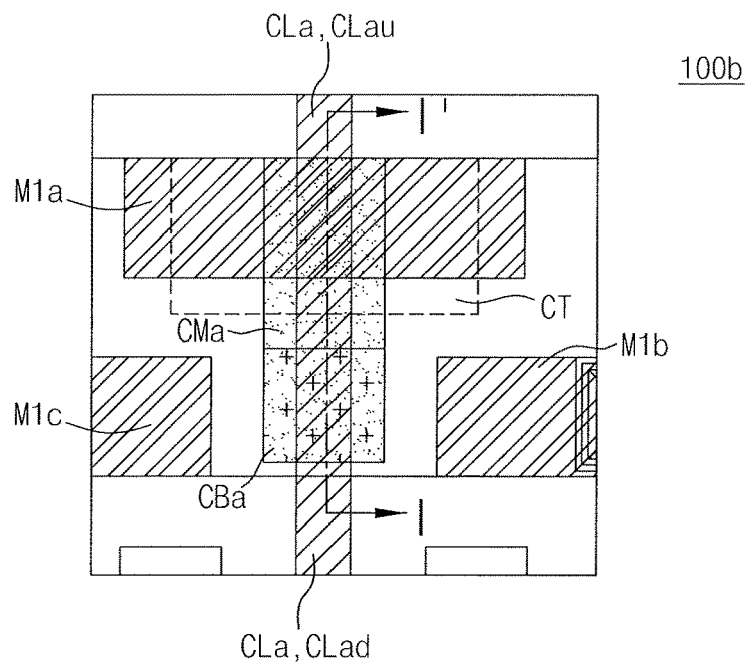
FIGS. 4a, 5a, and 6a illustrate enlarged views of a portion of the layout view of FIG. 1.
Figure 4B:
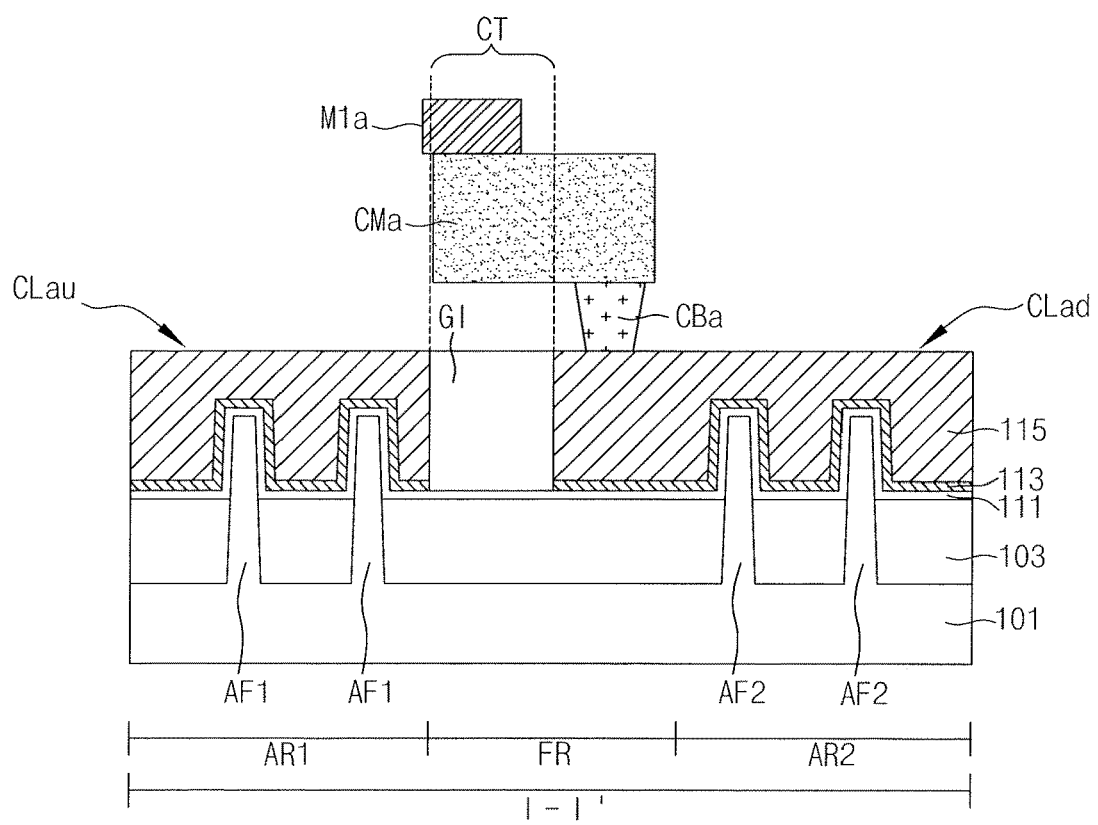
Figure 5A:
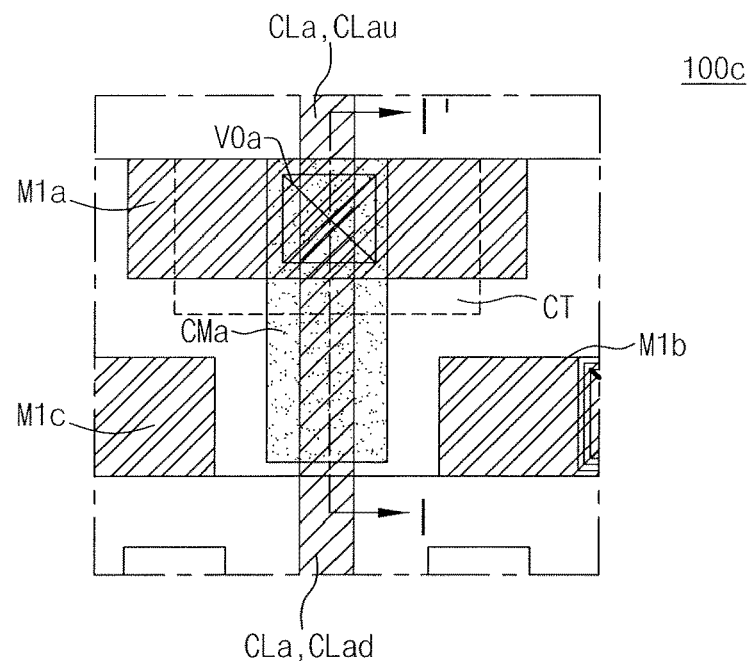
Figure 5B:
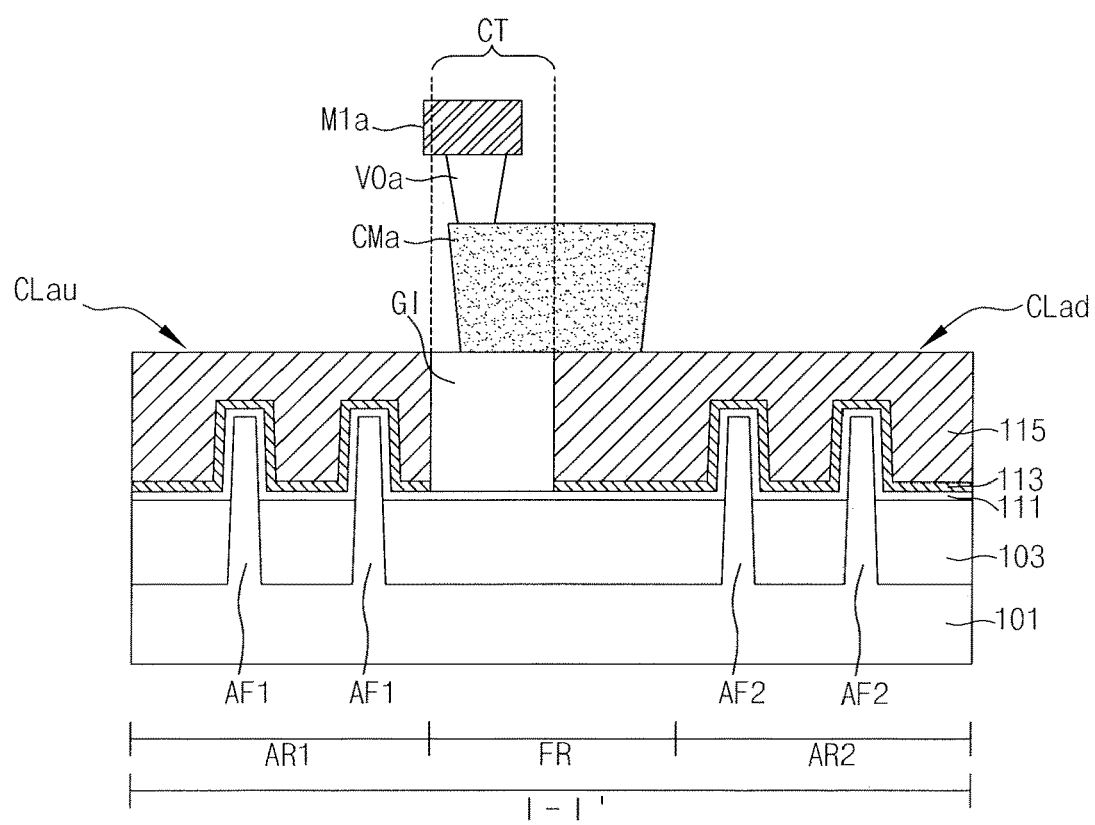
Figure 6A:
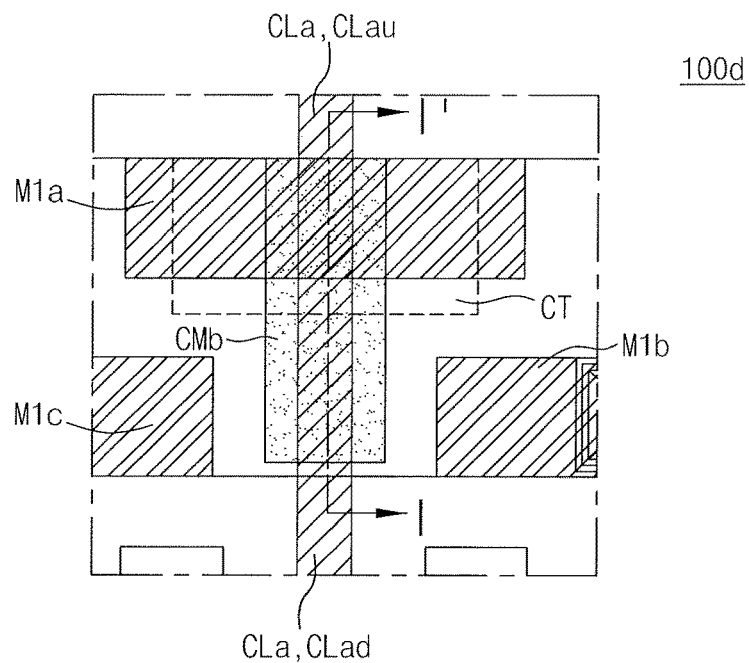
Figure 6B:
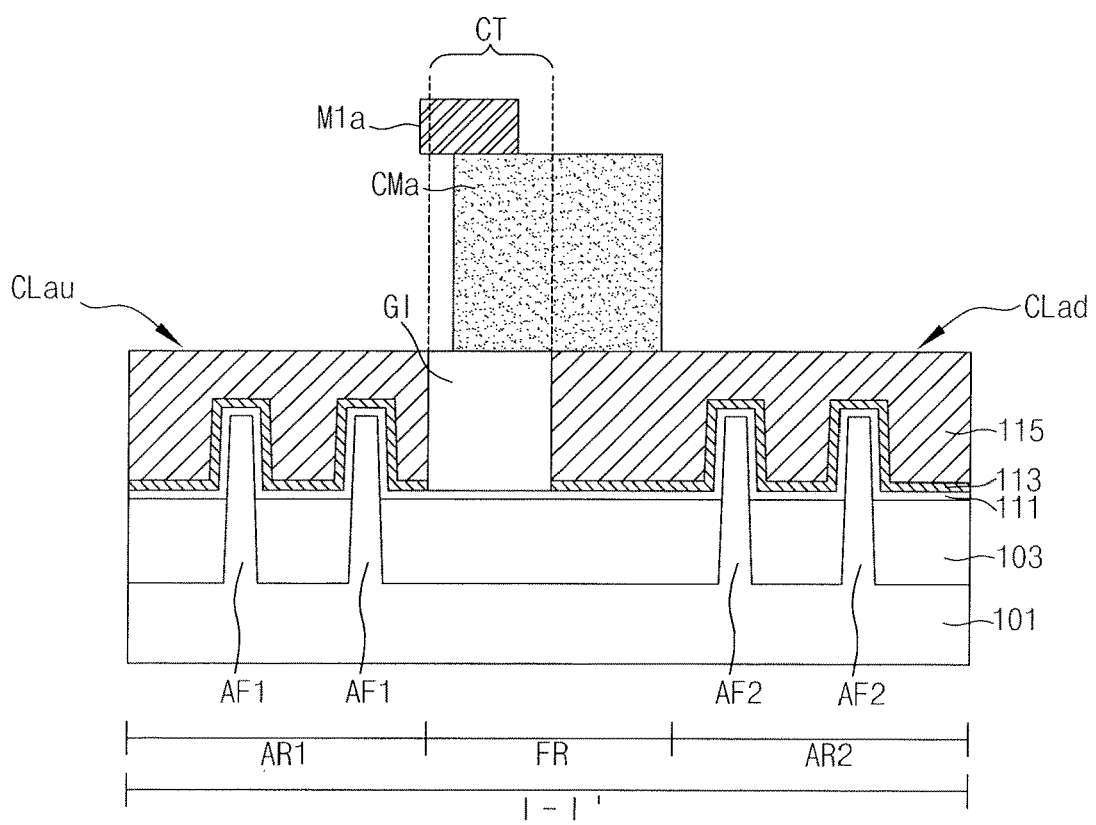

FIGS. 4a, 5a, and 6a illustrate enlarged views of a portion of the layout view of FIG. 1. FIG. 4b illustrates a cross-sectional view taken along line I-I' of FIG. 4a. FIG. 5b illustrates a cross-sectional view taken along line I-I' of FIG. 5a. FIG. 6b illustrates a cross-sectional view taken along line I-I' of FIG. 6a. In FIGS. 4b, 5b, and 6b, the jumper, the interlayer insulating layer, and the gate capping layer are omitted for simplicity. In FIGS. 1 to 6b, the same reference numerals denote the same components, and descriptions of the same components may be omitted for the sake of simplicity.

Referring to FIGS. 4a and 4b, a unidirectional standard cell 100b may include a first lower contact CBa on a lower conductive line CLad of a first conductive line CLa, a first upper contact CMa on the first lower contact CBa, and a first interconnection line M1a on the first upper contact CMa. For example, the first via V0a (see FIG. 2) between the first upper contact CMa and the first interconnection line M1a may be omitted, and an upper surface of the first upper contact CMa may be in direct contact with a lower surface of the first interconnection line M a. A height of the first upper contact CMa (e.g., relative to the main surface of the substrate 101) may be smaller than or substantially equal to a sum of heights of the first upper contact CMa and the first via V0a of FIG. 2.

Referring to FIGS. 5a and 5b, a unidirectional standard cell 100c may include a first upper contact CMa, which is on a lower conductive line CLad of a first conductive line CLa and a gate isolation layer GI, and a first via V0a and a first interconnection line M1a, which are on the first upper contact CMa. For example, the first lower contact CBa (see FIG. 2) between the first upper contact CMa and the first conductive line CLa may be omitted, and the first upper contact CMa may be directly connected to the lower conductive line CLad (i.e., the lower gate electrode) of the first conductive line CLa. A lower surface of the first upper contact CMa may be in contact with the lower conductive line CLad. The lower surface of the first upper contact CMa may be in contact with the gate isolation layer GI. In an implementation, the first upper contact CMa may be in contact with a gate capping layer. The first upper contact CMa may be spaced apart from an upper conductive line CLau (i.e., the upper gate electrode).

Referring to FIGS. 6a and 6b, a unidirectional standard cell 100d may include a first upper contact CMa, which is on a lower conductive line CLad of a first conductive line CLa and a gate isolation layer GI. For example, the first lower contact CBa and the first via V0a (see FIG. 2) may be omitted, the first upper contact CMa may be connected to be in direct contact with the lower conductive line CLad, and the first upper contact CMa may be connected to be in direct contact with a first interconnection line M1a.

Figure 7:
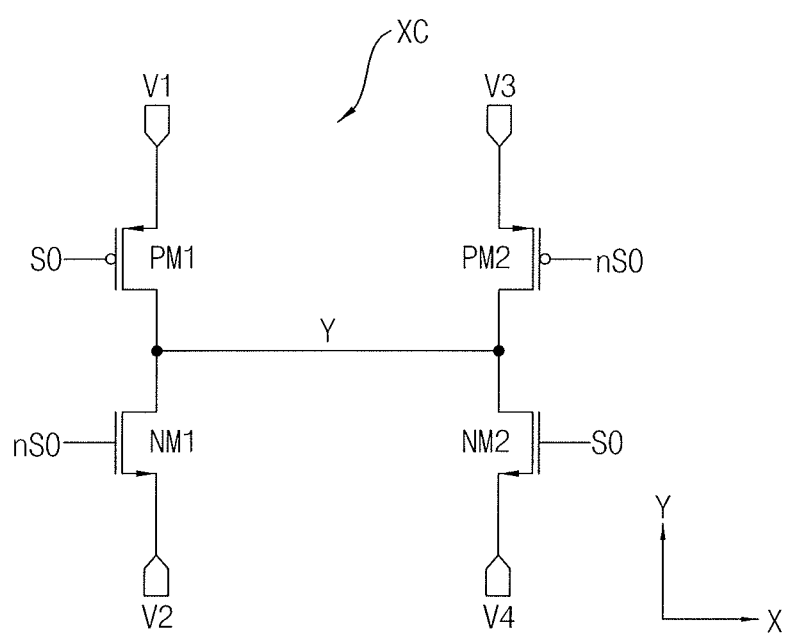
FIG. 7 illustrates a circuit diagram showing a cross-couple structure XC according to an example embodiment.

FIG. 7 illustrates a circuit diagram showing a cross-couple structure XC according to an example embodiment.

Referring to FIG. 7, the cross-couple structure XC may include a first PMOS transistor PM1 and a first NMOS transistor NM1, which are connected to each other in series, and a second PMOS transistor PM2 and a second NMOS transistor NM2, which are connected to each other in series. For example, the cross-couple structure XC may be included in various standard cells including sequential logic cells such as latches, flip-flops, and the like, or combinatorial logic cells such as multiplexers, adders, and the like.

The first PMOS transistor PM1 may have a source connected to a first voltage terminal VI, a gate which receives a first control signal SO, and a drain connected to an output terminal Y. The first NMOS transistor NM1 may have a drain connected to the output terminal Y, a gate which receives a second control signal nSO, and a source connected to a second voltage terminal V2. The second PMOS transistor PM2 may have a source connected to a third voltage terminal V3, a gate which receives the second control signal nSO, and a drain connected to the output terminal Y. The second NMOS transistor NM2 may have a drain connected to the output terminal Y, a gate which receives the first control signal SO, and a source connected to a fourth voltage terminal V4.

In an implementation, the gates of the first PMOS transistor PM1 and the second NMOS transistor NM2 may be electrically connected to each other to receive the first control signal SO. In an implementation, the gates of the first NMOS transistor NM1 and the second PMOS transistor PM2 may be electrically connected to each other to receive the second control signal nSO. Therefore, the first and second PMOS transistors PM1 and PM2 and the first and second NMOS transistors NM1 and NM2 may constitute the cross-couple structure XC.

Figure 8:
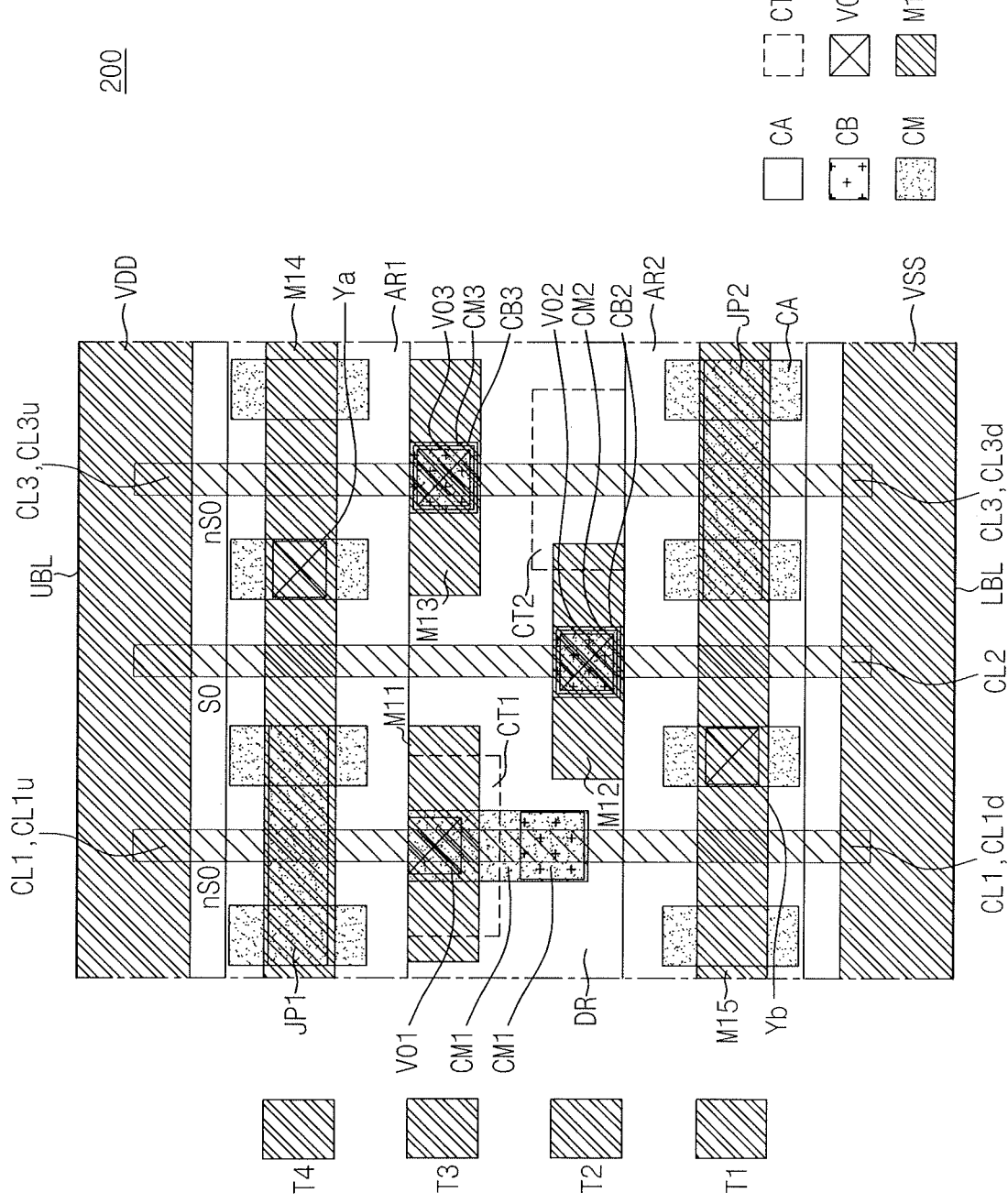
FIG. 8 illustrates a layout view of a portion of a unidirectional standard cell having a cross-couple structure XC according to an example embodiment.

FIG. 8 illustrates a layout view of a portion of a unidirectional standard cell having a cross-couple structure XC according to an example embodiment. The cross-couple structure XC of the unidirectional standard cell according to the example embodiment of FIG. 8 may correspond to the cross-couple structure XC of FIG. 7. In FIG. 8, only a portion of the unidirectional standard cell is shown for convenience of description, and the unidirectional standard cell may be designed to further include other components. For example, the unidirectional standard cell may further include a second interconnection structure disposed at a higher level than an M1 interconnection structure from a main surface of a substrate.

Referring to FIG. 8, power rails may be on an uppermost portion and a lowermost portion of a unidirectional standard cell 200, respectively. Each of the respective power rails may be a power terminal VDD or a ground terminal VSS. In an implementation, the power rail on the uppermost portion may be a ground terminal VDD and the power rail on the lowermost portion may be a ground terminal VSS.

The unidirectional standard cell 200 may be defined by an upper boundary line (UBL) and a lower boundary line (LBL) and may further include different circuits on left and right sides thereof, respectively.

The unidirectional standard cell 200 may include first and second active regions AR1 and AR2, conductive lines CL1, CL2, and CL3, source/drain contacts CA, jumpers JP1 and JP2, lower contacts CB, upper contacts CM, cutting layers CT, vias V0, and interconnection lines M1.

The first and second active regions AR1 and AR2, first and second conductive lines CL1 and CL2, first and second lower contacts CB1 and CB2, first and second upper contacts CM1 and CM2, first and second vias V01 and V02, a first jumper JP1, and a first cutting layer CT1 may have a structure corresponding to the first and second active regions AR1 and AR2, the first and second conductive lines CLa and CLb, the first and second lower contacts CBa and CBb, the first and second upper contacts CM1 and CM2, the first and second vias V0a and V0b, the jumper JP, and the cutting layer CT, which are described with reference to FIGS. 1 to 3, and repeated descriptions thereof may be omitted.

In the unidirectional standard cell 200, a third conductive line CL3, a second cutting layer CT2, a third lower contact CB3, a third upper contact CM3, a third via V03, and a third interconnection line M13 may be on a (e.g., right) side of the second conductive line CL2. A region corresponding to the second cutting layer CT2 may be removed so that the third conductive line CL3 may be separated into a second upper conductive line CL3u and a second lower conductive line CL3d. A gate isolation layer (or an isolation insulating layer) may be on the region corresponding to the second cutting layer CT2.

The unidirectional standard cell 200 may include a second contact jumper JP2 which connects source/drain contacts CA on both sides of the third conductive line CL3 to source/drain contacts CA on both sides of the second lower conductive line CL3d.

The unidirectional standard cell 200 may include a fourth interconnection line M14 and a first output contact Ya in the first active region AR1, and a fifth interconnection line M15 and a second output contact Yb in the second active region AR2.

Referring to FIGS. 7 and 8, the second conductive line CL2 and the source/drain regions on both sides of the second conductive line CL2 in the first active region AR1 may operate as a first transistor PM1, and the third conductive line CL3 and the source/drain regions on both sides of the third conductive line CL3 in the first active region AR1 may operate as a second transistor PM2. In an implementation, the first transistor PM1 and the second transistor PM2 may be PMOS transistors.

A lower conductive line CL1d of the first conductive line CL1 and source/drain regions on both sides of the lower conductive line CL1d in the second active region AR2 may operate as a third transistor NM1, and the second conductive line CL2 and source/drain regions on both, e.g., respective, sides of the second conductive line CL2 in the second active region AR2 may operate as a fourth transistor NM2. In an implementation, the third transistor NM1 and the fourth transistor NM2 may be NMOS transistors.

The second conductive line CL2 may be gated by the first control signal SO, and the first conductive line CL1 and the third conductive line CL3 may be gated by the second control signal nSO. The drains of the first transistor PM1 and the second transistor PM2 may be connected to the first output contact Ya, and the drains of the third transistor NM1 and the fourth transistor NM2 may be connected to the second output contact Yb. The first output contact Ya may be connected to the fourth interconnection line M14, and the second output contact Yb may be connected to the fifth interconnection line M15. The first output contact Ya and the second output contact Yb may be electrically connected to the output terminal Y. The fourth interconnection line M14 and the fifth interconnection line M15 may be connected to the output terminal Y.

Figure 9:
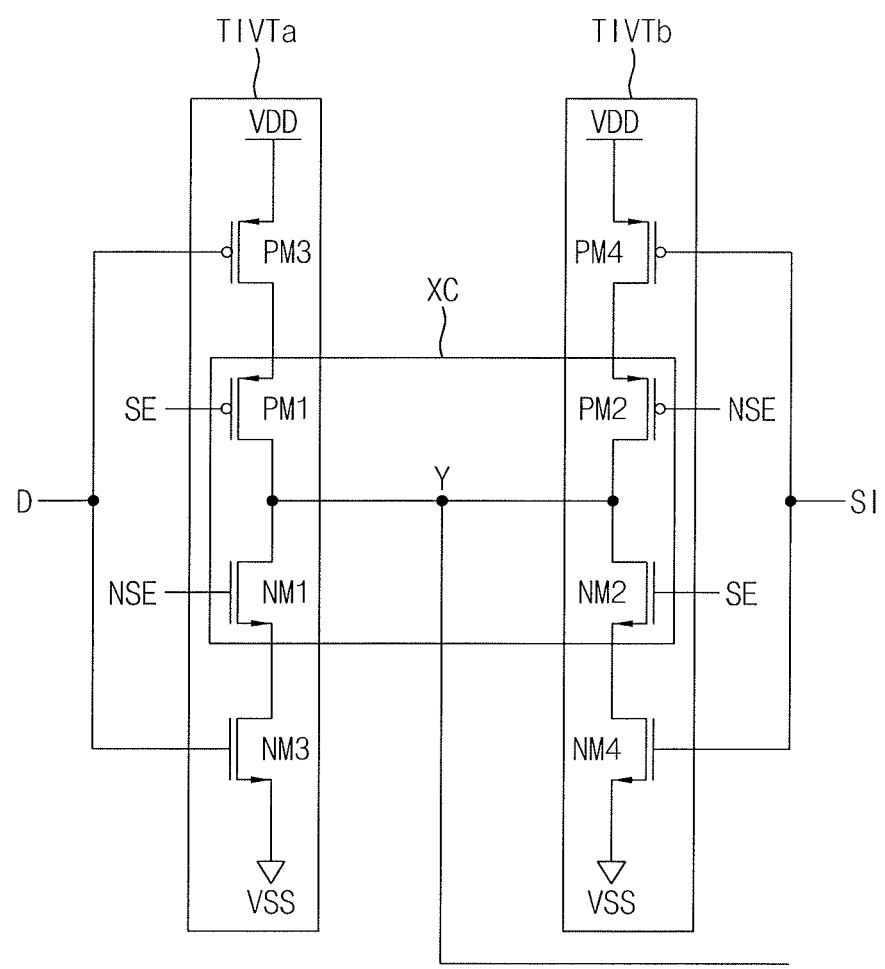
FIG. 9 illustrates a circuit diagram showing a multiplexer including a cross-couple structure XC according to an example embodiment.

FIG. 9 illustrates a circuit diagram showing a multiplexer including a cross-couple structure XC according to an example embodiment.

Referring to FIG. 9, the multiplexer may include a first tri-state inverter TIVTa and a second tri-state inverter TIVTb. The first and second tri-state inverters TIVTa and TIVTb may share an output terminal Y with each other and may be disposed to face each other. The multiplexer may be implemented as a standard cell. The cross-couple structure XC may correspond to the cross-couple structure XC of FIG. 7.

The first tri-state inverter TIVTa may include first and third PMOS transistors PM1 and PM3 and first and third NMOS transistors NM1 and NM3. For example, the third PMOS transistor PM3 may include a source connected to a power terminal VDD and a gate to which a data input signal D is applied, and the third NMOS transistor NM3 may include a source connected to a ground terminal VSS and a gate to which the data input signal D is applied. The first PMOS transistor PM1 may include a source connected to the drain of the third PMOS transistor PM3, a gate to which a scan enable signal SE is applied, and a drain connected to the output terminal Y. The first NMOS transistor NM1 may include a drain, which is connected to the first PMOS transistor PM1 and the output terminal Y, a gate to which a reverse scan enable signal NSE is applied, and a source connected to the third NMOS transistor NM3.

The second tri-state inverter TIVTb may include second and fourth PMOS transistors PM2 and PM4 and second and fourth NMOS transistors NM2 and NM4. For example, the fourth PMOS transistor PM4 may include a source connected to the power terminal VDD and a gate to which a scan input signal SI is applied, and the fourth NMOS transistor NM4 may include a source connected to the ground terminal VSS and a gate to which the scan input signal SI is applied. The second PMOS transistor PM2 may include a source connected to the drain of the fourth PMOS transistor PM4, a gate to which the reverse scan enable signal NSE is applied, and a drain connected to the output terminal Y. The second NMOS transistor NM2 may include a drain, which is connected to the second PMOS transistor PM2 and the output terminal Y, a gate to which the scan enable signal SE is applied, and a source connected to the fourth NMOS transistor NM4.

As described above, according to the example embodiment, the scan enable signal SE may be applied to the gates of the first PMOS transistor PM1 and the second NMOS transistor NM2, and the reverse scan enable signal NSE may be applied to the gates of the first NMOS transistor NM1 and the second PMOS transistor PM2. For example, the first and second PMOS transistors PM1 and PM2 and the first and second NMOS transistors NM1 and NM2 may constitute the cross-couple structure XC. According to an example embodiment, the cross-couple structure XC may be implemented including the standard cell of FIG. 8. According to an example embodiment, a multiplexer circuit may be implemented including the standard cell described with reference to FIGS. 1 to 6B.

Figure 10:
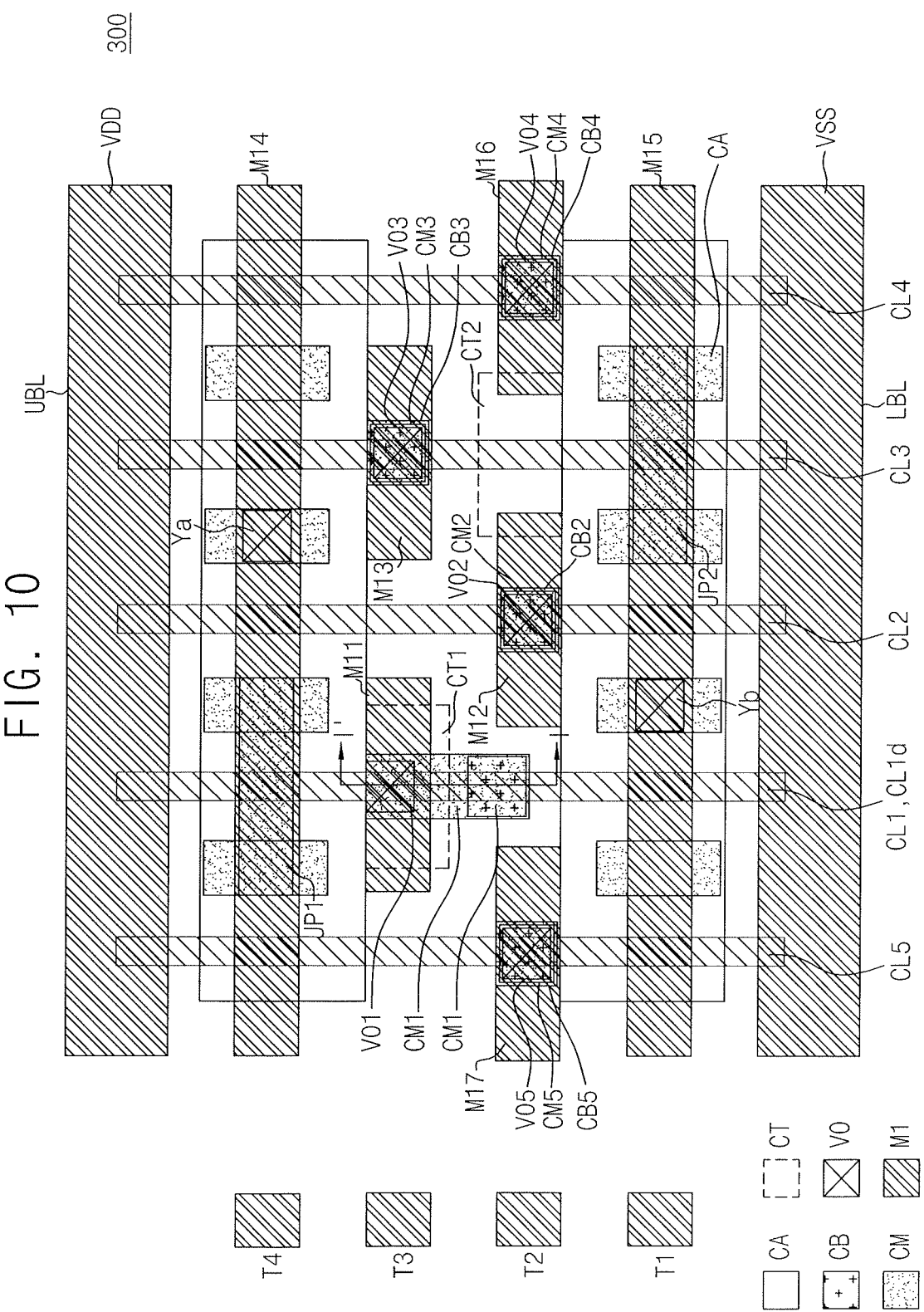
FIG. 10 illustrates a layout view of a portion of a unidirectional standard cell of a multiplexer having a cross-couple structure XC according to an example embodiment.

FIG. 10 illustrates a layout view a portion of a unidirectional standard cell of a multiplexer having a cross-couple structure XC according to an example embodiment. In FIGS. 8 and 10, the same reference numerals denote the same components, and repeated descriptions of the same components may be omitted for the sake of simplicity.

The unidirectional standard cell according to FIG. 10 may correspond to the multiplexer of FIG. 9. In FIG. 10, only a portion of the unidirectional standard cell is shown for convenience of description, and the unidirectional standard cell may be designed to further include other components. For example, the unidirectional standard cell may further include an interconnection structure disposed at a higher level than an M1 interconnection structure from a main surface of a substrate.

Referring to FIG. 10, in a unidirectional standard cell 300, a fourth conductive line CL4, a fourth lower contact CB4, a fourth upper contact CM4, a fourth via V04, and a sixth interconnection line M16 may be on a (e.g., right) side of a third conductive line CL3. In an implementation, in the unidirectional standard cell 300, a fifth conductive line CL5, a fifth lower contact CB5, a fifth upper contact CM5, a fifth via V05, and a seventh interconnection line M17 may be on a (e.g., left) side of a first conductive line CL1. In an implementation, a cross-sectional view taken along line I-I' of FIG. 10 may correspond to a cross-sectional view of FIG. 2.

Referring to FIGS. 9 and 10, a second conductive line CL2 and source/drain regions on both sides of the second conductive line CL2 on a first active region AR1 may operate as a first transistor PM1I, and the third conductive line CL3 and source/drain regions on both sides of the third conductive line CL3 in the first active region AR1 may operate as a second transistor PM2. In an implementation, the first transistor PM1 and the second transistor PM2 may be PMOS transistors.

The fourth conductive line CL4 and source/drain regions on both sides of the fourth conductive line CL4 in the first active region AR1 may operate as a fourth transistor PM4, and the fifth conductive line CL5 and source/drain regions on both sides of the fifth conductive line CL5 in the first active region AR1 may operate as a third transistor PM3. In an implementation, the third transistor PM3 and the fourth transistor PM4 may be PMOS transistors.

A lower conductive line CL1d of the first conductive line CL1 and source/drain regions on both sides of the lower conductive line CL1d on a second active region AR2 may operate as a fifth transistor NM1, and the second conductive line CL2 and source/drain regions on both sides of the second conductive line CL2 in the second active region AR2 may operate as a sixth transistor NM2. In an implementation, the fifth transistor NM1 and the sixth transistor NM2 may be NMOS transistors.

The fourth conductive line CL4 and source/drain regions on both sides of the fourth conductive line CL4 in the second active region AR2 may operate as a seventh transistor NM4, and the fifth conductive line CL5 and source/drain regions on both sides of the fifth conductive line CL5 in the second active region AR2 may operate as an eighth transistor NM3. In an implementation, the seventh transistor NM4 and the eighth transistor PM3 may be NMOS transistors.

The second conductive line CL2 may be gated by the scan enable signal SE, and the first conductive line CL1 and the third conductive line CL3 may be gated by the reverse scan enable signal NSE. The fourth conductive line CL4 may be gated by the scan input signal SI, and the fifth conductive line CL5 may be gated by the data input signal D.

The drains of the first transistor PM1 and the second transistor PM2 may be electrically connected to the first output contact Ya and the drain of the third transistor PM3 may be electrically connected to the source of the first transistor PM1. The drain of the fourth transistor PM4 may be electrically connected to the source of the second transistor PM2. The drains of the fifth transistor NM1 and the sixth transistor NM2 may be electrically connected to the second output contact Yb. The drain of the seventh transistor NM4 may be electrically connected to the source of the sixth transistor NM2 and the drain of the eighth transistor NM3 may be electrically connected to the source of the fifth transistor NM1.

The first output contact Ya may be connected to the fourth interconnection line M14 and the second output contact Yb may be connected to the fifth interconnection line M15. The first output contact Ya and the second output contact Yb may be electrically connected to the output terminal Y. The fourth interconnection line M14 and the fifth interconnection line M15 may be connected to the output terminal Y.

FIG. 11 illustrates a layout view of a portion of a unidirectional standard cell of a multiplexer having a cross-couple structure XC according to an example embodiment. For example, the unidirectional standard cell of FIG. 11 may have an M1 interconnection structure having five tracks T1, T2, T3, T4, and T5.

The unidirectional standard cell of FIG. 11 may correspond to that of the multiplexer of FIG. 9. In FIG. 11, only a portion of the unidirectional standard cell is shown for convenience of description, and the unidirectional standard cell may be designed to further include other components. For example, the unidirectional standard cell may further include an interconnection structure disposed at a higher level than the M1 interconnection structure from a main surface of a substrate.

Referring to FIG. 11, a unidirectional standard cell 400 may include first and second active regions AR1 and AR2, conductive lines CL1, CL2, CL3, CL4, and CL5, source/drain contacts CA, lower contacts CB, upper contacts CM, cutting layers CT, vias V0, and interconnection lines M1.

A region corresponding to a first cutting layer CT1 may be removed so that a first conductive line CL may be separated into a first upper conductive line CL1u and a first lower conductive line CL1d. A region corresponding to a second cutting layer CT2 may be removed so that a third conductive line CL3 may be separated into a second upper conductive line CL3u and a second lower conductive line CL3d. A gate isolation layer (or an isolation insulating layer) may be on each of the regions corresponding to the first cutting layer CT1 and the second cutting layer CT2. In an implementation, the first cutting layer CT1 may be adjacent to a first active region AR1 and may overlap a third track T3 and/or a fourth track T4. The second cutting layer CT2 may be close to the second active region AR2 and may overlap a second track T2 and/or the third track T3.

First to fifth interconnection lines M11, M12, M13, M14, and M15 may be respectively on the first to fifth tracks T1, T2, T3, T4, and T5, which extend in a first direction and are spaced apart from each other in parallel in a second direction. The first to fifth tracks T1, T2, T3, T4, and T5 may be sequentially arranged from the second active region AR2 to the first active region AR1. The first track T1 may be in the second active region AR2, the fifth track T5 may be in the first active region AR1, and the second to fourth tracks T2, T3, and T4 may be between the first active region AR1 and the second active region AR2. The second track T2 may be adjacent to the second active region AR2, the fourth track T4 may be adjacent to the first active region AR1, and the third track T3 may be between the second track T2 and the fourth track T4.

In an implementation, the first interconnection line M11 may be on the third track T3, the second interconnection line M12 may be on the second track T2, and the third interconnection line M13 may be on the fourth track T4. The fourth interconnection line M14 may be on the fifth track T5, and the fifth interconnection line M15 may be on the first track T1.

At least a portion of the first interconnection line M11 may overlap the first cutting layer CT1 (or the gate isolation layer) in a plan view. The first interconnection line M11 may be at a position crossing the first conductive line CL1 in a plan view. In a plan view, the second interconnection line M12 may cross the second conductive line CL2 and the third interconnection line M13 may cross the third conductive line CL3.

The first interconnection line M11 may be electrically connected to the lower conductive line CL1d of the first conductive line CL1. The second interconnection line M12 may be electrically connected to the second conductive line CL2. The third interconnection line M13 may be electrically connected to the second upper conductive line CL3u of the third conductive line CL3.

The electrical connection between the respective interconnection lines M1 and the respective conductive lines CL may be achieved using the lower contacts CB, the upper contacts CM, and the vias V0. The lower contacts CM may be on the conductive lines CL, the upper contacts CM may be on the lower contacts CB, and the vias V0 may be on the upper contacts CM.

In an implementation, a first lower contact CB1 may be on a region substantially corresponding to the second track T2 on the first lower conductive line CL1d. A first via V01 may be on the third track T3 on the first lower conductive line CL1d. A first upper contact CM1 may extend to the first via V01 in the second direction on the first lower contact CB1. The first lower conductive line CL1d may be electrically connected to the first interconnection line M11 through the first lower contact CB1, the first upper contact CM1, and the first via V01.

In an implementation, in the unidirectional standard cell 400, a fourth conductive line CL4, a fourth lower contact CB4, a fourth upper contact CM4, a fourth via V04, and a sixth interconnection line M16 may be on a (e.g., right) side of the third conductive line CL3. In the unidirectional standard cell 400, a fifth conductive line CL5, a fifth lower contact CB5, a fifth upper contact CM5, a fifth via V05, and a seventh interconnection line M17 may be on a (e.g., left) side of the third conductive line CL3. In an implementation, the sixth interconnection line M16 may be on the second track T2 or the fourth track T4. The seventh interconnection line M17 may be on the second track T2 or the third track T3.

By way of summation and review, various methods have been used to implement cross gate connection circuits in a cell such as a multiplexer (MUX) or a flip-flop. Methods of improving space efficiency of an overall layout according to arrangement of gate contacts, source/drain contacts, and interconnections may be considered.

According to the example embodiments, a unidirectional standard cell including a cross-couple structure may include a jumper and a cutting layer, and power efficiency and operation performance may be improved while a degree of integration of an integrated circuit and a semiconductor device including the same is improved.

One or more embodiments may provide an integrated circuit having a layout for increasing power efficiency and a degree of integration.

One or more embodiments may provide a technique for improving space efficiency and a degree of integration of standard cells by improving a degree of freedom of arrangement of contacts on conductive lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first active region extending in a first direction;
a second active region extending in the first direction;
a field region between the first active region and the second active region;
a gate structure including:
an upper gate electrode overlapping the first active region and extending in a second direction crossing the first direction, and
a lower gate electrode overlapping the second active region, extending in the second direction, and being on a same line as the upper gate electrode;
a gate isolation layer between the upper gate electrode and the lower gate electrode;
source/drain regions on respective sides of the upper gate electrode;
a contact jumper in the first active region, the contact jumper crossing the upper gate electrode and electrically connecting the source/drain regions; and
a first upper contact extending in the second direction in the field region and overlapping the lower gate electrode and the gate isolation layer,
wherein the upper gate electrode is a dummy gate electrode.

2. The semiconductor device as claimed in claim 1, wherein the first upper contact is electrically connected to the lower gate electrode and is electrically insulated from the upper gate electrode.

3. The semiconductor device as claimed in claim 1, further comprising a first lower contact electrically connecting the lower gate electrode to the first upper contact in the field region.

4. The semiconductor device as claimed in claim 1, wherein the first upper contact is spaced apart from the upper gate electrode.

5. The semiconductor device as claimed in claim 1, wherein a lower surface of the first upper contact is in contact with the lower gate electrode and the gate isolation layer.

6. The semiconductor device as claimed in claim 1, further comprising a first interconnection line overlapping the gate isolation layer and the first upper contact in the field region and extending in the first direction.

7. The semiconductor device as claimed in claim 6, further comprising a first via electrically connecting the first upper contact to the first interconnection line in the field region.

8. The semiconductor device as claimed in claim 6, wherein an upper surface of the first upper contact is in contact with the first interconnection line.

9. The semiconductor device as claimed in claim 6, further comprising:
a substrate at a bottom of the semiconductor device; and
a second interconnection line and a third interconnection line in the field region, the second interconnection line and the third interconnection line:
extending in the first direction,
being spaced apart from each other in the first direction,
being at the same level as the first interconnection line relative to a main surface of the substrate, and
being on respective sides of the first upper contact.

10. The semiconductor device as claimed in claim 9, wherein a distance from the second active region to the second interconnection line and the third interconnection line in the second direction is less than a distance from the second active region to the first interconnection line and the gate isolation layer in the second direction.

11. The semiconductor device as claimed in claim 1, further comprising a substrate at a bottom of the semiconductor device, wherein the first upper contact and the contact jumper are at a same level relative to a main surface of the substrate.

12. An integrated circuit comprising a standard cell, wherein the standard cell includes:
a first active region and a second active region having different conductivity types and each extending in a first direction;
a field region between the first active region and the second active region;
a substrate;
a first conductive line extending in a second direction that crosses the first direction, the first conductive line being on the substrate in the first active region, the second active region, and the field region;

an isolation insulating layer in the field region, the isolation insulating layer separating the first conductive line into a first upper conductive line and a first lower conductive line and electrically insulating the first upper conductive line and the first lower conductive line from each other;

a first lower contact in the field region and on the first lower conductive line;

a first upper contact in the field region and on the first lower contact, the first upper contact extending in the second direction and overlapping the isolation insulating layer; and a contact jumper in the first active region, the contact jumper crossing the first upper conductive line, wherein the contact jumper is at a same level as or at a lower level than the first upper contact relative to a main surface of the substrate.

13. The integrated circuit as claimed in claim 12, wherein the isolation insulating layer is in the field region and adjacent to the first active region.

14. The integrated circuit as claimed in claim 12, wherein at least a portion of the isolation insulating layer is in the first active region.

15. The integrated circuit as claimed in claim 12, further comprising a first via on the first upper contact and overlapping the isolation insulating layer.

16. The integrated circuit as claimed in claim 12, further comprising a first interconnection line extending in the first direction, crossing the first upper contact, and overlapping the isolation insulating layer.

17. The integrated circuit as claimed in claim 16, further comprising a second interconnection line and a third interconnection line in the field region, the second interconnection line and the third interconnection line:

extending in an extending direction of the first interconnection line, and being on respective sides of the first upper contact in a plan view, wherein a distance from the contact jumper to the second interconnection line and the third interconnection line in the second direction is greater than a distance from the contact jumper to the first interconnection line in the second direction.

18. The integrated circuit as claimed in claim 12, further comprising source/drain regions in the first active region, the source/drain regions being on respective sides of the first upper conductive line, wherein the contact jumper connects the source/drain regions.

19. An integrated circuit comprising a standard cell, wherein the standard cell includes:

a first active region and a second active region having different conductivity types and each extending in a first direction;

a field region between the first active region and the second active region;

an upper conductive line in the first active region, the upper conductive line extending in a second direction that crosses the first direction;

a lower conductive line in the second active region and the field region, the lower conductive line extending in the second direction, being spaced apart from the upper conductive line in the second direction, and being on a same line as the upper conductive line;

an interconnection line in the field region, the interconnection line extending in the first direction and being between the upper conductive line and the lower conductive line in a plan view; and an upper contact in the field region, the upper contact extending in the second direction and overlapping the interconnection line and the lower conductive line, wherein:

the lower conductive line is electrically connected to the interconnection line, and the upper conductive line is electrically insulated from the lower conductive line.

20. The integrated circuit as claimed in claim 19, further comprising source/drain regions on respective sides of the upper conductive line, wherein the source/drain regions cross the upper conductive line and are electrically connected to each other.

* * * * *